United States Patent [19]

Inamoto et al.

[11] Patent Number: 4,688,054
[45] Date of Patent: Aug. 18, 1987

[54] LIQUID JET RECORDING HEAD

[75] Inventors: Tadayoshi Inamoto, Machida; Hiromichi Noguchi; Megumi Munakata, both of Atsugi, all of Japan

[73] Assignee: Canon Kabushiki Kaisha, Tokyo, Japan

[21] Appl. No.: 880,210

[22] Filed: Jun. 30, 1986

[30] Foreign Application Priority Data

Jul. 9, 1985 [JP] Japan .................................. 60-149260
Jul. 13, 1985 [JP] Japan .................................. 60-153352
Jul. 13, 1985 [JP] Japan .................................. 60-153354

[51] Int. Cl.$^4$ ........................................... G01D 15/18
[52] U.S. Cl. ................................ 346/140 R; 156/668; 522/102; 525/65
[58] Field of Search ................ 346/1.1, 140; 156/668; 525/65; 522/102, 922

[56] References Cited

U.S. PATENT DOCUMENTS

| 4,394,670 | 7/1983 | Sugitani | 346/140 |
| 4,412,224 | 10/1983 | Sugitani | 346/140 X |
| 4,417,251 | 11/1983 | Sugitani | 346/140 X |
| 4,437,100 | 3/1984 | Sugitani | 346/140 X |

Primary Examiner—Joseph W. Hartary
Attorney, Agent, or Firm—Fitzpatrick, Cella, Harper & Scinto

[57] ABSTRACT

A liquid jet recording head has a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition comprising the component (i) shown below and at least one of the components (ii) and (iii) shown below:

(i) a graft copolymerized polymer comprising a trunk chain composed mainly of structural units derived from at least one monomer selected from the group consisting of alkyl methacrylate, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxylic containing acrylic or vinyl monomers, (D) N-vinylpyrrolidone or its derivatives, (E) vinylpyridine or its derivatives and (F) acrylamide derivatives represented by the following general formula I:

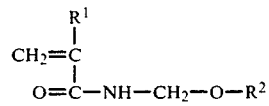

(wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxy groups) added to said trunk chain;

(ii) an epoxy resin comprising at least one compound having two or more epoxy groups in the molecule, the epoxy groups existing in said epoxy resin being partially esterified with an unsaturated carboxylic acid; and (iii) a monomer having an ethylenically unsaturated bond.

12 Claims, 10 Drawing Figures

LIQUID JET RECORDING HEAD

BACKGROUND OF THE INVENTION

1. Field of the Invention

This invention relates to a liquid jet recording head, more particularly to a recording head for generation of small droplets of a liquid for recording to be used in a liquid jet recording system in which recording is performed by generating small droplets of a liquid for recording such as ink, etc., and attaching them onto a recording medium such as paper.

2. Related Background Art

The liquid jet recording system which performs recording by generating small droplets of a liquid for recording such as ink, etc., and attaching them onto a recording medium such as paper is attracting attention as a recording system which generates little noise during recording, and also is capable of high speed recording and further enables recording on a plain paper without requiring any special treatment such as fixing; and various types of this system have been actively studied.

The recording head portion of the recording device to be used in the liquid jet recording system generally consists of an orifice for discharging a liquid for recording (liquid discharging outlet), a liquid passage connected to the orifice and having a portion at which the energy for discharging the liquid for recording acts on the liquid for recording and a liquid chamber for storing the liquid for recording to be fed into the liquid passage.

The energy for discharging the liquid for recording during recording is generated in most cases by means of discharge energy generating elements of various types such as a heat generating element, piezoelectric element, etc., which is arranged at a predetermined position at the portion where the discharging energy is permitted to act on the liquid for recording which constitutes a part of the liquid passage (energy acting portion).

As the method for preparing the liquid jet recording head with such a constitution, there have been known, for example, the method comprising the steps of forming fine grooves on a flat plate of glass, metal, etc.; by cutting or etching and bonding another appropriate plate onto the flat plate having such grooves formed thereon to thereby form liquid passages or the method comprising the steps of forming groove walls of a cured photosensitive resin on a substrate having a discharging energy generating element arranged thereon according to a photolithographic step to provide grooves for the liquid passages on the substrate and bonding another flat plate (covering) onto the grooved plate thus formed to thereby form liquid passages (for example, Japanese Laid-open Patent Application No. 57-43876).

Of these methods for preparation of the liquid jet recording heads, the latter method employing a photosensitive resin is more advantageous than the former method in that liquid jet recording heads can be provided with better quality and cheaper cost because it enables fine working with better precision and better yield and bulk production with ease.

As the photosensitive resin to be used in preparation of such recording heads, there have been employed those used for pattern formation in printing plates or printed-wiring or those known as the photocurable coating materials or adhesives to be used for glass, metal, ceramics, etc. Also, in aspect of working efficiency, dry film type resins have been primarily utilized.

In the recording head employing a cured film of a photosensitive resin, in order to obtain excellent characteristics such as high recording characteristic, durability and reliability, etc., the photosensitive resin to be used for the recording head is required to have the following characteristics:

(1) Particularly, excellent adhesion as the cured film to a substrate;

(2) excellent mechanical strength and durability, etc., when cured, and (3) excellent sensitivity and resolution during patterning by use of pattern exposure light.

However, under the present situation, none of the photosensitive resins used for formation of the liquid jet recording head hitherto known in the art satisfy all of the above requisite characteristics.

To describe in more detail, those employed for pattern formation in printing plates, printed-wirings, etc., as the photosensitive resin for recording head are inferior in adhesion or close contact with glass, ceramics, plastic film, etc., to be used as the substrate, although they are excellent in sensitivity and resolution, and also insufficient in mechanical strength and durability when cured. For this reason, as the stage of preparation of recording heads, or in the course during usage, there is involved the drawback that deformation of the resin cured film or peel-off from the substrate or damage are liable to occur, which may cause marked impairment of reliability of the recording head such as lowering in recording characteristics by impeding the flow of the liquid for recording in the liquid passages or making the liquid droplet discharging direction unstable.

On the other hand, those which are known as photocurable type coating materials or adhesives to be used for glass, metals, ceramics, etc., although having advantages of excellent close contact or adhesiveness with the substrate formed of these materials and also satisfactory mechanical strength and durability are obtained when cured, are inferior in sensitivity and resolution and therefore requires an exposure device of higher intensity or an exposure operation for longer time. Further, their inherent characteristics cannot afford a precise and high density pattern with good resolution, whereby there is involved the problem that it is not suitable for a recording head for which minute precise working is particularly required.

SUMMARY OF THE INVENTION

The present invention has been accomplished in view of the problems as described above and an object of the present invention is to provide a liquid jet recording head having a liquid passage wall comprising a resin cured film satisfying all of the requisite characteristics as mentioned above, which is inexpensive, precise, high in reliability and excellent in durability.

Another object of the present invention is to provide a liquid jet recording head having a constitution of which the liquid passage is minutely worked with good precision and good yield.

It is also another object of the present invention to provide a liquid jet recording head which is high in reliability and excellent in durability even when formed into multi-orifices.

According to the present invention, there is provided a liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition comprising the component (i) shown below and at least one of the components (ii) and (iii) shown below:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

$$CH_2=C\begin{matrix}R^1\\|\\|\\O=C-NH-CH_2-O-R^2\end{matrix} \quad (I)$$

(wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxy groups), added to said trunk chain;

(ii) a monomer having an ethylenically unsaturated bond; and (iii) an epoxy resin comprising at least one compound having two or more epoxy groups in the molecule, the epoxy groups existing in said epoxy resin being partially esterified with an unsaturated carboxylic acid.

DESCRIPTION OF PREFERRED EMBODIMENTS

Figure 1A:
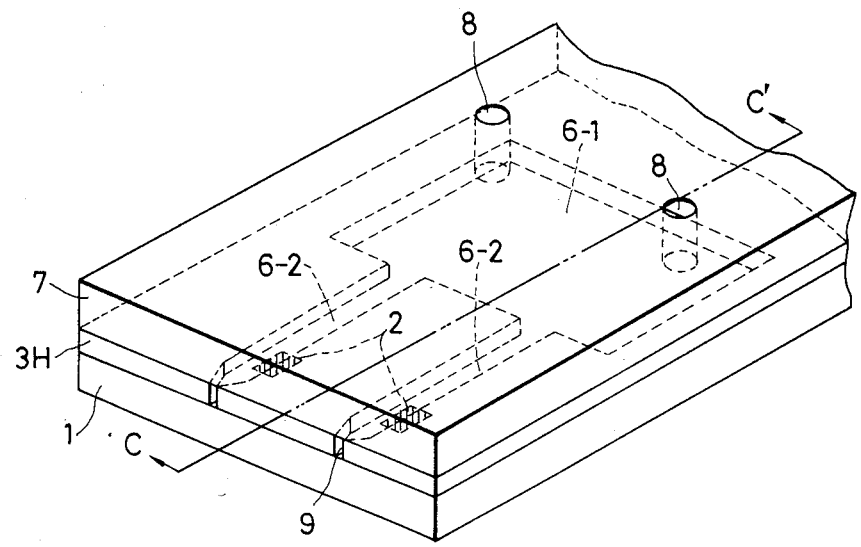
FIGS. 1A and B to FIGS. 6A and B are schematic illustrations for explanation of the liquid jet recording head of the present invention and the methods for producing the same.

Referring now to the drawings, the liquid jet recording head of the present invention is described in detail.

Figure 1B:
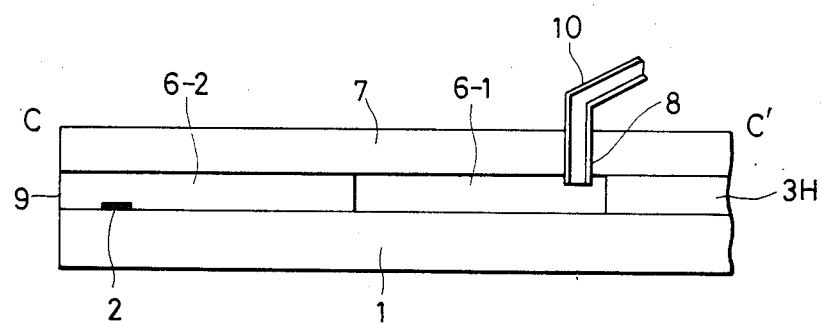

FIG. 1 is an embodiment of the liquid recording head of the present invention, FIG. 1A showing a perspective view of the main portion thereof and FIG. 1B showing a sectional view of FIG. 1A cut along the line C—C'.

The liquid jet recording head comprises basically a substrate 1, a resin cured film 3H provided on the substrate 1 and subjected to patterning to a desired shape and a covering 7 laminated on the resin cured film 3H, and these members form orifices 9 for discharging a liquid for recording, liquid passages 6-2 communicated to the orifices 9 and having the portions at which the energy for discharging the liquid for recording acts on the liquid for recording and a liquid chamber 6-1 for storing the liquid for recording to be supplied into the liquid passages 6-2. Further, at the thru-hole 8 provided on the covering 7, a feeding pipe 10 for feeding the liquid for recording from outside of the recording head into the liquid chamber 6-1 is bonded. In FIG. 1A, the feeding pipe 10 is omitted.

During recording, the energy for discharging the liquid for recording is generated by applying discharging signals as desired on the discharge energy generating elements 2 of various types such as heat-generating elements, piezoelectric elements, etc., arranged at predetermined positions in the portions for acting the discharging energy on the liquid for recording constituting a part of the liquid passages 6-2 through wirings (not shown) connected to these elements 2.

The substrate 1 constituting the recording head of the present invention comprises a glass, ceramics, plastic or metal and the energy generating elements 2 are arranged in a desired number at predetermined positions. In the embodiment of FIG. 1, two generating elements are provided, but the number and arrangement of the generating elements are determined depending on the desired constitution of the recording head.

On the other hand, the covering 7 comprises a flat plate of glass, ceramics, plastic or metal and is bonded onto the resin cured film 3H by fusion or adhesion by use of an adhesive, and it is also provided with a thru-hole 8 for connecting a feeding pipe 10 at a predetermined position.

In the recording head of the present invention, the resin cured film 3H subjected to patterning to the predetermined shape constituting the walls of the liquid passages 6-2 and the liquid chamber 6-1 is obtained by subjecting a layer comprising a resin composition with the composition as described below on the substrate 1 or on the covering 7 to patterning according to the photolithographic step. Also, the resin cured film 3H may also be obtained as integrated with covering by subjecting a covering comprising a resin composition having the composition as described below.

The resin composition to be used for formation of a resin cured film provided on a substrate for constituting such a portion which becomes at least the liquid passage is an active energy ray-curing resin composition comprising the component (i) shown below and at least one of the component (ii) and the component (iii) shown below as the essential components:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

$$CH_2=C\begin{matrix}R^1\\|\\|\\O=C-NH-CH_2-O-R^2\end{matrix} \quad (I)$$

(wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxy groups), added to said trunk chain;

(ii) a monomer having an ethylenically unsaturated bond; and (iii) an epoxy resin comprising at least one compound having two or more epoxy groups in the molecule, the epoxy groups existing in said epoxy resin being partially esterified with an unsaturated carboxylic acid.

The active energy ray-curing resin composition comprising these components has good adhesion to a substrate comprising glass, plastic, ceramics, etc., particularly when formed into a cured film, is also excellent in resistance to the liquid for recording such as ink as well as mechanical strength, and further has the excellent characteristic as the constituent member of a liquid jet recording head that a precise and high resolution pattern can be formed by patterning with an active energy ray. Further, the resin composition can be used as a dry film, and also in that case, the above excellent characteristics can be exhibited. The composition of the active energy ray-curing resin composition to be used for formation of the recording head of the present invention is described in detail.

The graft copolymerized polymer (i) which is the essential component of the active energy ray-curing resin composition comprises a trunk chain having relatively rigid properties suitable for a structural material having graft chains composed mainly of the above monomers (A)–(F) having hydrophilic property and exhibiting excellent adhesion to the substrate added thereto.

In constituting the above graft copolymerized polymer, specific examples of the monomers (A)–(F) to be used for constitution of the graft chains are shown below. Examples of the acrylic monomer containing hydroxyl group(s) of (A) include 2-hydroxyethyl (meth)acrylate (hereinafter, (meth)acrylate means to include both of acrylate and methacrylate), 2-hydroxypropyl(meth)acrylate, 3-chloro-2-bydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, or monoester of 1,4-cyclohexanedimethanol with acrylic acid or methacrylic acid, including those obtained under the trade names of Aronix M5700 (produced by Toa Gosei Kagaku K.K.), TONE M100 (caprolactoneacrylate, produced by Union Carbide), Light Ester HO-mpp (produced by Kyoeisha Yushi Kagaku Kogyo K.K.), Light Ester M-600A (trade name of 2-hydroxy-3-phenoxypropylacrylate, produced by Kyoeisha Yushi Kagaku Kogyo K. K.), and also monoesters of divalent alcohols such as 1,10-decanediol, neopentylglycol, bis(2-hydroxyethyl)terephthalate, bisphenol A and addition products of ethylene oxide or propylene oxide with (meth)acrylylic acid.

Examples of the amino or alkylamino containing acrylic monomer of (B) include (meth)acrylamide, N,N-dimethylaminoethyl(meth)acrylamide, N,N-dimethyl(meth)acrylamide, N,N-dimethylaminopropyl(meth)acrylamide, N,N-di-t-butylaminoethyl(meth)acrylamide and the like.

Examples of the carboxyl containing acrylic or vinyl monomer of (C) include (meth)acrylic acid, fumaric acid, itaconic acid or those known under the trade names of Aronix M-5400, Aronix M-5500, etc.

Examples of vinylpyridine or its derivatives of (E) include 2-vinylpyridine, 4-vinylpyridine, 2-vinyl-6-methylpyridine, 4-vinyl-1-methylpyridine, 2-vinyl-5-ethylpyridine, 4-(4-pipenilinoethyl)pyridine and the like.

The above monomers (A)–(E) all have hydrophilic properties and impart firm adhesion when the composition employed in the present invention is adhered to a substrate such as glass, ceramics, plastics, etc.

Examples of the acrylamide derivative represented by the formula I of (F) include monomers having hydrophilic property and also heat crosslinkability such as N-methylol(meth)acrylamide, N-propoxymethyl(meth)acrylamide, N-n-butoxymethyl(meth)acrylamide, β-hydroxyethoxymethyl (meth)acrylamide, N-ethoxymethyl(meth)acrylamide, N-methoxymethyl(meth) acrylamide, α-hydroxymethyl-N-methylolacrylamide, α-hydroxyethyl-N-butoxymethylacrylamide, α-hydroxypropyl-N-propoxymethylacrylamide, α-ethyl-N-methylolacrylamide, α-propyl-N-methylolacrylamide and the like. These monomers (F) have hydrophilic property as a matter of course, and also condensing crosslinkability by heating, and will generally form crosslinked bonds by elimination of water molecules or alcohol at a temperature of 100° C. or higher, thereby to form a network structure also in the graft copolymerized polymer itself after curing, whereby the pattern obtained by curing can be further improved in chemical resistance and mechanical strength, etc., to make the present invention more effective.

Also, to the above monomers (A)–(F), monomer which can be crosslinked by ring opening by heat such as glycidyl(meth)acrylate may be partially added to constitute the graft chains, whereby the same effect as in the above (F) can be obtained.

In addition to the above thermal crosslinking, for the same purpose, it is also effective to crosslink the graft copolymerized polymer with an active energy ray by introducing a photopolymerizable monomer into a part of the graft chains of the graft copolymer contained in the resin composition for formation of a resin cured film in the present invention. As the method for imparting photopolymerizability to the graft chain, there may be employed for example, (i) the method in which a carboxyl containing monomer exemplified by (meth)acrylic acid, etc., or an amino or tertiary amine containing monomer is copolymerized, followed by the reaction with glycidyl(meth)acrylate, etc.;

(j) the method in which a partial urethane compound of polyisocyanate having one isocyanate group and one or more acrylic ester groups in one molecule is reacted with the hydroxyl group, amino group or carboxyl group in the graft chain;

(k) the method in which acrylic acid chloride is reacted with the hydroxyl groups in the graft chain;

(l) the method in which an acid anhydride is reacted with the hydroxyl group in the graft chain, followed by the reaction with glycidyl(meth)acrylate;

(m) the method in which the hydroxyl group in the graft chain is condensed with the condensing crosslinkable monomer as exemplified in (F), thereby leaving acrylamide group in the side chain;

(n) the method in which the hydrxyl group in the graft chain is reacted with glycidyl(meth)acrylate; etc.

When the graft chain of the graft copolymerized polymer is heat crosslinkable, it is preferable to perform heating after formation of a pattern by irradiation of an active energy ray. On the other hand, also when the above graft chain is photopolymerizable, there is no problem in performing heating within the range permissible in aspect of heat resistance of the substrate, and rather preferable results can be given by heating.

The graft chains are not limited to those derived only from the hydrophilic monomers as exemplified by the above (A)–(F), but the graft chains may also contain various hydrophobic monomers which can exhibit various other functions as the copolymer component within the range of 0 to about 25 weight %.

The monomer constituting the trunk chain of the graft copolymerized polymer is an alkyl methacrylate having 1 to 4 carbon atoms in the alkyl group such as methyl methacrylate, ethyl methacrylate, isobutyl methacrylate, t-butyl methacrylate, etc., acrylonitrile and styrene.

The trunk chain is not limited to those derived from only the above monomers, but it may be also a trunk chain using other monomers such as methyl acrylate, ethyl acrylate, n-butyl acrylate, lauryl acrylate, n-butyl methacrylate, 2-ethylhexyl methacrylate, glycidyl methacrylate, vinyl acetate, etc., as the copolymer component within the range of 0 to about 50 weight %.

In the resin composition in employed for formation of the recording head in the present invention, the above trunk chain gives high cohesive strength to the composition. The composition can be provided in various shapes depending on the purpose of uses such as solutions or solid films, etc. in forming the recording head. However, it is preferable to use a relatively rigid trunk chain having a glass transition temperature of about 50° C. or higher in order to maintain the composition in shape of a film. In this application, the trunk chain to be used may be constituted of two or more kinds having different glass transition temperatures. On the other hand, when the composition is to be used as a solution, it is possible to use a trunk chain having a low glass transition temperature so as to give the composition flexibility. However, also in this case, in order to obtain a pattern having excellent chemical resistance and high mechanical strength, it is preferable to use a trunk chain having a high glass transistion temperature.

The graft copolymerized polymers to be used in the resin composition for formation of a resin cured film in the present invention may be classified broadly into those having no curability, those having photopolymerizability and those having heat crosslinkability. In either case, the graft copolymerized polymer enables precise patterning by imparting form maintaining property to the composition in the curing steps (namely active energy ray irradiation and optional heat curing) of the composition of the present invention, and also gives excellent adhesiveness, chemical resistance as well as high mechanical strength to the pattern obtained by curing.

The above graft copolymerized polymer can be prepared according to the known methods, specifically by various methods as disclosed in "Base and Application of Polymer Alloy" p. 10–35 (edited by Polymer Society of Japan, published by Tokyo Kagaku Dojin K. K., 1981). Examples of those methods include (1) the chain transfer method, (2) the method by use of radiation, (3) the oxidation polymerization method, (4) the ion graft polymerization method and (5) macromonomer method. For the graft copolymer contained in the resin composition to be used for formation of the recording head of the present invention, since the surface active effect is marked when the length of the graft chains are uniform, it is preferable to use the method of (4) and (5), particularly preferably the macromonomer method of (5) which is advantageous in design of materials. The graft copolymer should preferably have a weight-average molecular weight of about 5000 to 300000 and, when used as a dry film, preferably about 30000 to 300000.

The monomer (ii) having an ethylenically unsaturated bond to be used in the resin composition for formation of a resin cured film in the present invention is a component for permitting the resin composition for formation of a resin cured film employed in the present invention to exhibit curability with an active energy ray, particularly imparting excellent sensitivity to an active energy ray to the resin composition, preferably having a boiling point of 100° C. or higher under atmospheric pressure, having two or more ethylenically unsaturated bonds, and various known monomers curable by irradiation of an active energy ray can be used.

Specific examples of such monomers having two or more ethylenically unsaturated bonds include (a) acrylic acid esters or methacrylic acid esters of polyfunctional epoxy resins having two mor more epoxy groups in one molecule, (b) acrylic acid esters or methacrylic acid esters of alkyleneoxide addition products of polyhydric alcohols, (c) polyester acrylates having acrylic acid ester group at the terminal ends of the molecular chains of polyesters having molecular weights of 500 to 3000 comprising dibasic acid and dihydric alcohol, (d) the reaction products between polyisocyanates and acrylic acid monomers having hydroxyl groups. The above monomers (a)–(b) may be urethane-modified products having urethane bonds in the molecules.

Examples of the monomers belonging to (a) include acrylic acid or methacrylic acid esters of polyfunctional epoxy resins to be used for formation of the resin component (half-esterified epoxy resin) for the resin component (iii) which becomes one of the components in the resin composition employed in the present invention as hereinafter described.

Examples of the monomers belonging to (b) include ethyleneglycol di(meth)acrylate, diethyleneglycol (meth)acrylate, polyethyleneglycol di(meth)acrylate, 1,6-hexanediol (meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K. K.), and also those known under the trade names of NK ester BPE-200, BPE-500, BPE-1300, A-BPE-4 (all produced by Shin Nakamura Kagaku K. K.), etc., may also be available.

The monomers belonging to (c) may be exemplified by those known under the trade names of Aronix M-6100, M-6200, M-6250, M-6300, M-6400, M-7100, M-8030, M-8060, M-8100 (all produced by Toa Gosei Kagaku K. K.). Examples of the monomers belonging to (b) and having urethane bonds of polyester include those known under the trade names of Aronix M-1100, Aronix M-1200 both produced by Toa Gosei Kagaku K. K.).

The monomers belonging to (d) may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K. K.), etc. The hydroxyl containing acrylic monomer as herein mentioned may include typically (meth)acrylic acid esters, preferably hydroxyethyl acrylate, hydroxyethyl methacrylate, hydroxypropyl acrylate. It is also possible to use other acrylic monomers containing hydroxyl group(s) mentioned in the present specification as useful for the graft chains in the graft copolymerized polymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractonemodified hydroxyalkyl(meth)acrylate, tetrahydrofurfulyl acrylate, phenoxyethyl acrylate; and others.

Anyway, by use of the above monomer having ethylenically unsaturated bonds, high sensitivity and satisfactory curability to an active energy ray can be imparted to the resin composition for formation of a resin cured film employed in the present invention.

The resin component (iii) obtained by esterifying a part of the epoxy groups existing in the epoxy resin comprising one or more compounds having two or more epoxy groups in one molecule with an unsaturated carboxylic acid to be used for formation of a resin cured film in the present invention (hereinafter abbreviated as half-esterified epoxy resin) is a component which permits the composition to exhibit curability with an active energy ray similarly with the monomer (ii) having ethylenically unsaturated bonds as described above or together with the monomer (ii) and, in addition thereto, imparts better adhesiveness with a substrate, water resistance, chemical resistance, dimensional stability, etc., to the cured film formed by coating the resin composition in liquid state on various substrates comprising glass, plastics, ceramics, etc., followed by curing, or to the cured film formed by adhering the resin composition in the form of a dry film on various substrates.

The half-esterified epoxy resin (iii) can be obtained by, for example, reacting an epoxy resin with a predetermined amount of an unsaturated carboxylic acid in the co-presence of an addition catalyst and a polymerization inhibitor, in the presence or absence of a solvent, under the temperature condition of 80° to 120° C., thereby esterifying a part of the epoxy groups existing in the epoxy resin with the carboxylic acid.

Examples of the epoxy resin comprising one or more compounds containing 2 or more epoxy groups in one molecule which can be used for formation of the half-esterified epoxy resin (iii) include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula II:

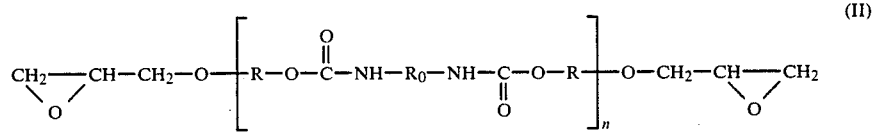

(wherein R represents an alkyl group or an oxyalkyl group, $R_0$ represents

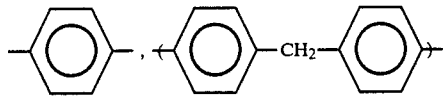

or an alkyl group), and mixtures of at least one of these.

Specific examples of these polyfunctional epoxy resins include those as mentioned below. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.) and Epicrone 800 (trade name, produced by Dainippon Ink Kagaku Kogyo K. K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438 and 439 (trade names, produced by Dow Chemical Co.), etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K. K.), CYRACURE 6100, 6110, 6200 and ERL 4090, 4617, 2256, 5411 (trade names, produced by Union Carbide Co.), etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopenthylglycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentylglycol diglycidyl ether, etc; the polyglycidiyl ether derived from aromatic polyhydric alochol may be, for example, diglycidyl ether of an addition product of bisphenol A added with 2 to 16 mols of alkyleneoxide, a diglycidyl ether of an addition product of bisphenol F added with 2 to 16 mols of alkyleneoxide, a diglycidyl ether of an addition product of bisphenol S added with 2 to 16 mols of alkyleneoxide.

While various unsaturated carboxylic acids can be used for half-esterification of the epoxy resin, it is preferable for imparting better curability with an activation energy to the resin composition of the present invention to use a monobasic unsaturated carboxylic acid having an acrylic or methacrylic vinyl group on at least one terminal end of the molecule and a carboxyl group on the other terminal end.

Typical examples of such unsaturated carboxylic acid may include acrylic acid and methacrylic acid, and it is also possible to use a monoester compound obtained by the reaction between a dicarboxylic acid and a (meth)acrylic acid ester having one hydroxyl group.

The above dicarboxylic acid may include phthalic acid, isophthalic acid, terephthalic acid, oxalic acid, malonic acid, succinic acid, glutaric acid, adipic acid, pimelic acid, suberic acid, azelaic acid, sebacic acid, isosebacic acid, tetrahydrophthalic acid and anhydrydes thereof.

The above (meth)acrylic acid ester having one hydroxyl group may include, 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth)acrylate and 6-hydroxyhexyl (meth)acrylate and the like.

Examples of the addition reaction catalyst which can be used for half-esterification reaction of epoxy resin include metal halides such as zinc chloride, lithium chloride or the like; sulfide compounds such as dimethyl sulfide, methylphenyl sulfide or the like; sulfoxide compounds such as dimethyl sulfoxide, methylethylsulfoxide or the like; tertiary amine compounds such as N,N-dimethylaniline, pyridine, triethylamine, benzyldimethylamine or the like, and their hydrochlorides or hydrobromides; quaternary ammonium salts such as tetramethylammonium chloride, trimethyldodecylbenzylammonium chloride, triethylbenzylamnonium chloride or the like; sulfonic acid compounds such as p-toluene-sulfonic acid; and mercaptan compounds such as ethylmercaptan, propylmercaptan or the like.

Further, examples of the polymerization inhibitor which can be used for half-esterification include hydroquinone, alkyl or aryl-substituted hydroquinone, tertiary butylcatechol, pyrogallol, naphthylamine, β-naphthol, cuprous chloride, 2,6-di-tert-butyl-p-cresol, phenothiazine, pyridine, N-nitrosodiphenylamine and nitrobenzene.

The solvent which can be used when carrying out half-esterification in the presence of a solvent may include toluene, xylene, methyl isobutyl ketone, methyl ethyl ketone, ethyl acetate, butyl acetate and isobutyl acetate, etc.

The amounts of the epoxy resin and the unsaturated carboxylic acid used during half-esterification may be suitably selected so that the ratio of the epoxy groups in the epoxy resin to the carboxyl groups in the unsaturated carboxylic acid may preferably 1:0.2 to 1:0.7, more preferably 1:0.2 to 1:0.55.

Thus, if the esterification ratio of the epoxy groups with the unsaturated carboxylic acid in the half-esterified epoxy resin is higher than the above range, good chemical resistance or dimensional stability derived from the epoxy resin cannot be effectively exhibited in the resin composition employed for formation of the recording head of the present invention. On the contrary, if the esterification ratio is lower than the above range, the pattern forming characteristic when forming the recording head of the present invention for formation of a pattern comprising a cured film will deteriorate. To describe in more detail, even if the monomer having ethylenically unsaturated bonds as mentioned above may be used to an extent which does not impair the characteristic of the cured film formed of the resin composition, in other words, in the increased amount possible within the range shown in the present invention, the polymerization degree in polymerization by pattern exposure is low and only gives product with low contrast in solubility in the developer, with the result that sharpness cannot can be obtained at the outline portion of the pattern and the working conditions for obtaining a sharp pattern become extremely narrow.

As described above, the active energy ray-curing resin composition employed for formation of the recording head of the present invention, in addition to having the high sensitivity and satisfactory curability to the active energy ray based on unsaturated double bonds possessed by the monomer (ii) having ethylenically unsaturated bonds and/or the half-esterified epoxy resin (iii) contained as the components, also has heat curability based on the epoxy groups possessed by the half-esterified epoxy resin (iii) when containing the half-esterified epoxy resin (iii). For example, a cured film obtained by curing by irradiation of an active energy ray on the resin composition of the present invention, followed by further heat curing by heating at 80° C. or higher for about 10 minutes to 3 hours, can be further endowed with good adhesiveness with the substrate, checmical resistance, dimensional stability, etc., derived from the epoxy resin.

The active energy ray-curing resin composition employed for formation of a resin cured film in the present invention can be cured by an active energy ray, and it is preferable to add thereto a radical polymerization initiator capable of forming organic free radicals which can be activated by the action of an active energy ray in the resin composition when employing an active energy ray with wavelength of 250 nm to 450 nm. As the radical polymerization initiator, known substances having the property of being activated with an active energy ray, forming organic free radicals and initiating radical polymerization can be used without any particular limitation.

Specific examples of such radical polymerization initiators include benzyl, benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4′-bis(N,N-diethylamino)benzophenone benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, α,α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-one (e.g. Darocure 1116, produced by MERCK Co.), 2-hydroxy-2-methyl-1-phenylpropane-1-one (Darocure 1173, produced by MERCK Co.); etc., as preferable ones. In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylamino benzoic acid n-amylester, p-dimethylaminobenzoic acid isoamylester, etc.

Further, in the active energy ray-curing resin composition employed in the present invention, in order that the epoxy groups possessed by the half-esterified epoxy resin (iii) can be also photopolymerized by the action of the active energy ray, there can be formulated aromatic onium salt compounds having photosensitivity containing an element belonging to the group VIa shown in Japanese Patent Publication No. 52-14278 or aromatic onium salt compounds having photosensitivity containing an element belonging to the group Va shown in Japanese Patent Publication No. 52-14279.

The aromatic onium salt compounds having photosensitivity of the element belonging to the group VIa or the group Va may include typically the compounds of the following formula III:

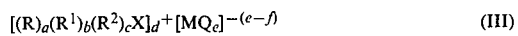

(wherein R is a monovalent organic aromatic group, $R^1$ is a monovalent organic aliphatic group selected from alkyl groups, dicycloalkyl groups and substituted alkyl groups, $R^2$ is a polyvalent organic group for constituting heterocyclic or fused ring structure selected from aliphatic groups and aromatic groups, X is an element belonging to the group VIa selected from sulfur, selenium and tellurinm or an element belonging to the group Va selected from nitrogen, phosphorus, arsenic, antimony and bismuth, M is a metal or metalloid and Q is a halogen atom, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and $d = e - f$). These compounds have the characteristic that the onium salt will release a Lewis acid by irradiation of light on these compounds, which acid cures the epoxy resin.

Specific examples of such photosensitive aromatic onium salt compounds containing an element belonging to the group VIa or the group Va may include the photosensitive aromatic onium salts of the elements belonging to the group VIa as shown below:

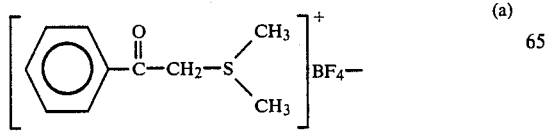 (a)

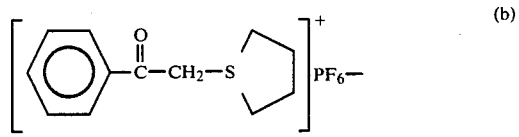 (b)

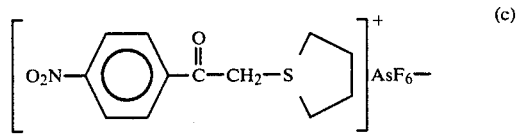 (c)

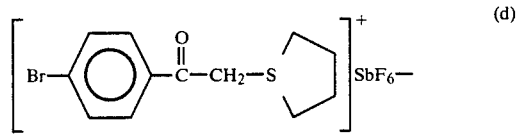 (d)

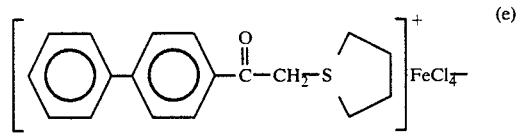 (e)

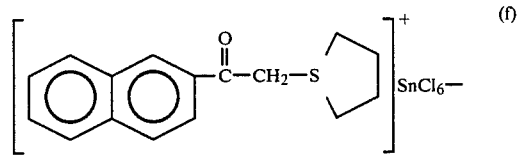 (f)

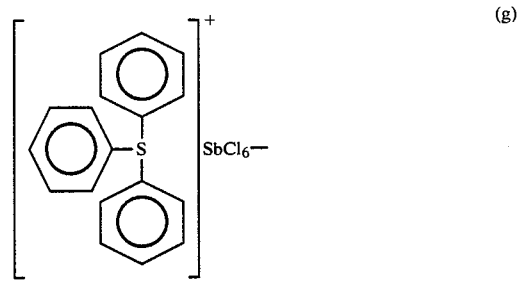 (g)

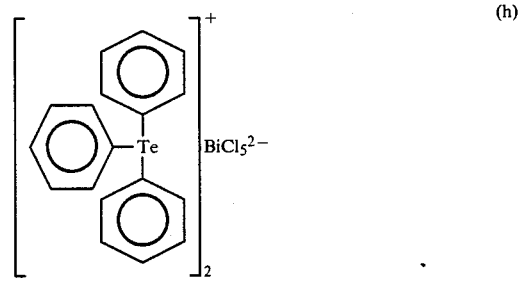 (h)

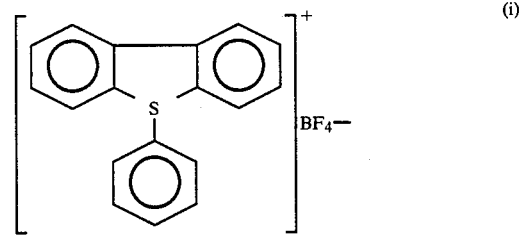 (i)

-continued

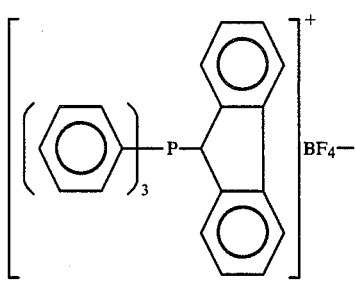

and photosensitive aromatic onium salts of the elements belonging to the group Va as shown below:

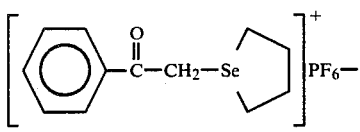 (1)

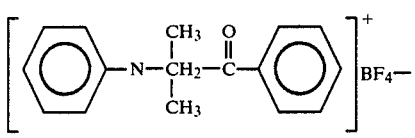 (2)

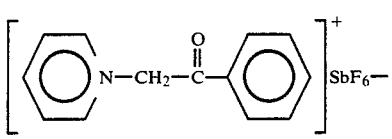 (3)

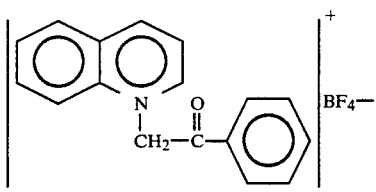 (4)

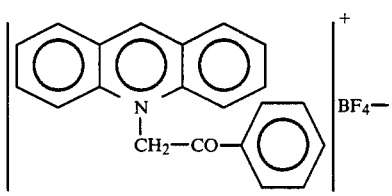 (5)

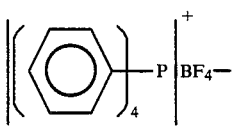 (6)

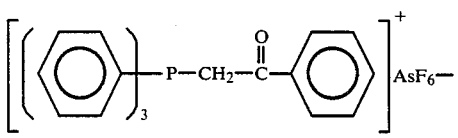 (7)

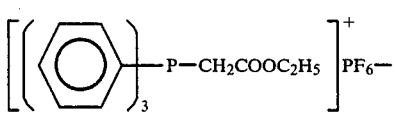 (8)

-continued

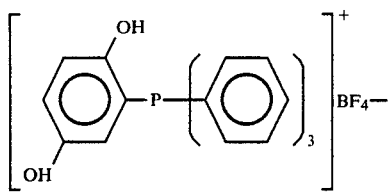 (9)

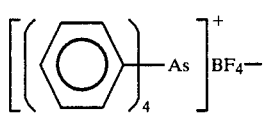 (10)

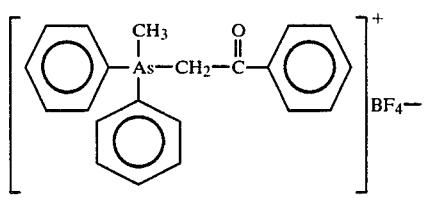 (11)

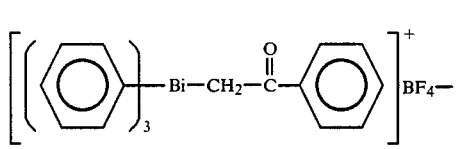 (12)

The constitutional ratio of the above materials constituting the active energy ray-curing resin composition employed in the present invention may be made 20 to 80 parts by weight, preferably 20 to 50 parts by weight for the graft copolymerized polymer (i) and 80 to 20 parts by weight, preferably 80 to 50 parts by weight for the total of the monomer having ethylenically unsaturated bonds (ii) and the half-esterified epoxy resin (iii) [(i)+(ii)+(iii)=100 parts by weight, this formula representing also the case when one of (ii) and (iii) is 0].

When the resin composition of the present invention contains both of the monomer having ethylenically unsaturated bonds (ii) and the half-esterified epoxy resin (iii), it is preferable that the content ratio of both components in the resin composition employed in the present invention may be 30:70 to 70:30, in order to exhibit effectively the characteristics of the both components.

More specifically, the half-esterified epoxy resin (iii) is effective for approximating the physical properties of the cured film such as adhesiveness, chemical resistance and dimensional stability to the excellent physical properties of the epoxy resin cured film, while the monomer having ethylenically unsaturated bonds (ii) is effective for imparting high sensitivity to an activation energy to the resin composition, respectively. If the content ratio of the components (ii) and (iii) is within the range as specified above, a resin composition and a cured film from the composition endowed with the properties of both components can be obtained. In contrast, if the content of the half-esterified epoxy resin (iii) is higher than the above range, the content of the component participating directly in curability to the active energy ray in the resin composition is not sufficient, whereby in the case of pattern formation, polymerization degree in polymerization by pattern exposure becomes lower, with the result that no sharpness can be obtained at the outline portion of the pattern, and also the working conditions for obtaining a sharp pattern become extremely narrow. Further, when the content of the half-esterified epoxy resin (iii) is lower than the above range, the contents of the epoxy groups in the resin composition becomes smaller, with the result that polymerization reaction by heating after exopsure can occur with difficulty, whereby excellent characteristics such as adhesion to the substrate, chemical resistance, dimensional stability, etc., cannot be fully exhibited.

When a radical polymerization initiator capable of being activated by the action of an activation energy ray is used in the active energy ray-curing resin composition employed in the present invention, the polymerization initiator may be used in an amount within the range from 0.1 to 20 parts by weight, preferably from 1 to 10 parts by weight based on 100 parts by weight of the resin components comprising the graft copolymerized polymer and the monomer having ethylenically unsaturated bonds and/or the half-esterified epoxy resin [(i)+(ii) or (i)+(iii) or (i)+(ii)+(iii)].

When a photosensitive aromatic onium salt containing an element belong to the group VIa or the group Va is used, the content of the compound may be 0.2 to 15 parts by weight, preferably 0.5 to 10 parts by weight based on 100 parts by weight of the resin components comprising the graft copolymerized polymer and the monomer having ethylenically unsaturated bonds and/or the half esterified epoxy resin [(i)+(ii) or (i)+(iii) or (i)+(ii)+(iii)].

As the solvent to be used when employing the active energy ray-curing resin composition in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and thier halogen derivatives, aliphatic solvents containing chlorine such as methylene chloride, 1,1,1-trichloroethane, etc. These solvents can be also used as the developer for the resin composition employed in the present invention.

The active energy ray-curing resin composition employed in the present invention may further contain, in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiagine, etc. As the colorant there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used in the composition of the present invention.

Also, in the active energy ray-curing resin composition employed in the present invention, curing agents for epoxy resins may be added, if desired. The curing agent for epoxy resin which can be added in the resin composition employed in the present invention may include, for example, polyamines, polyamides, acid anhydrides, boron trifluoride-amine complex, dicyandiamide, imidazoles, complexes of imidazole and metal salts.

The resin composition comprising the composition as described above is cured with an active energy ray to form the resin cured film 3H possessed by the recording head of the present invention. Next, as an embodiment of the case when employing a dry film type as the resin composition for formation of the resin cured film 3H, the method for preparing the liquid jet recording head of the present invention is described in detail by referring to the drawings.

FIGS. 2 to 6 are schematic illustrations for description of the preparation procedure of the liquid jet recording head of the present invention.

Figure 2:
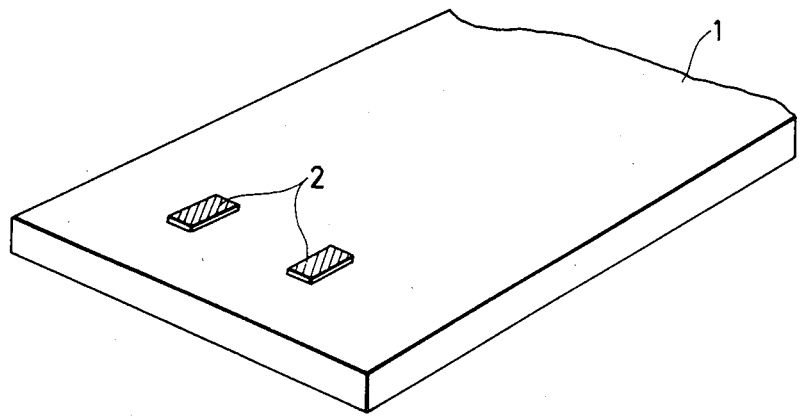

For formation of the liquid jet recording head of the present invention, first, as shown in FIG. 2, a discharge energy generating element 2 such as heat generating element or piezoelectric element is arranged in a desired number on a substrate 1 such as glass, ceramic, plastic or a metal. If desired, for the purpose of imparting resistance to the liquid for recording or electrical insulating property, etc., to the surface of the substrate 1, the surface may be coated with a protective layer of $SiO_2$, $Ta_2O_5$, glass, etc. Also, to the discharge energy generating element 2 is connected electrodes for inputting recording signals, although not shown in the drawing.

Figure 3A:
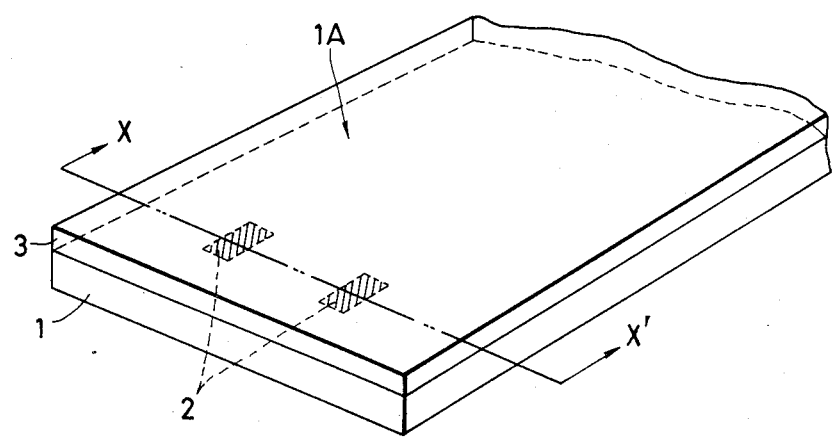
Figure 3B:
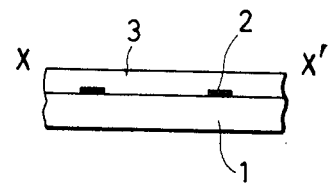

Next, the surface of the substrate 1 obtained after the step shown in FIG. 1 is cleaned and at the same time dried at, for example, 80° to 150° C., and then the active energy ray-curing resin composition 3 as described above of the dry film type (film thickness, about 20 μm to 200 μm), as shown in FIGS. 3A and 3B is heated to about 40° to 150° C. and laminated on the substrate surface 1A at a speed of, for example, 0.5 to 0.4 f/min. under the pressurizing condition of 1 to 3 Kg/cm².

Figure 4:
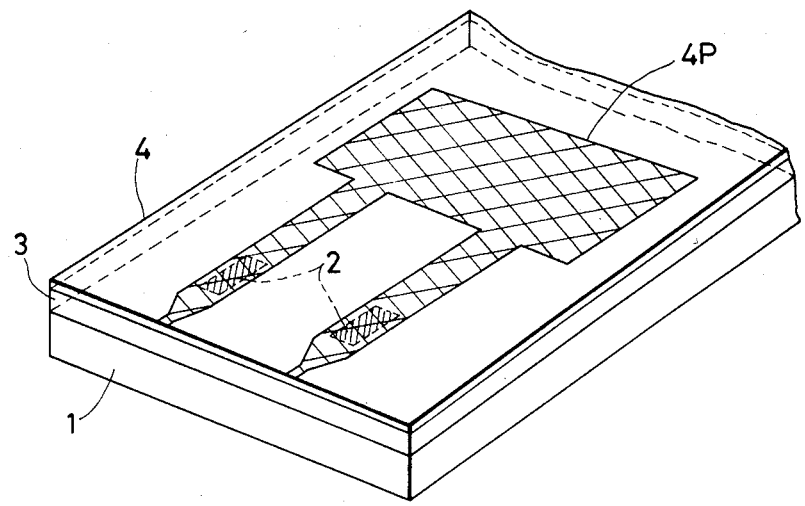

Subsequently, as shown in FIG. 4, on the dry film layer 3 provided on the substrate surface 1A, a photomask 4 having a pattern 4P with a desired shape which does not transmit the active energy ray is superposed and then exposure is effected from above the photomask 4.

Registration between the photomask 4 and the substrate 1 is effected so that the above element 2 may be positioned in the liquid passage region finally formed after the steps of exposure and developing processing, etc., for example, according to the method in which registration marks are previously drawn respectively on the substrate 1 and the mask 4 and registration is effected following the marks.

By carrying out such an exposure, the portion other than that covered with the pattern, namely the portion exposed of the dry film layer 3 is cured by polymerization, to become insoluble in a solvent, while the unexposed portion remains soluble in a solvent.

The active energy ray to be used for such a pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm² to 100 mW/cm² at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

Figure 5A:
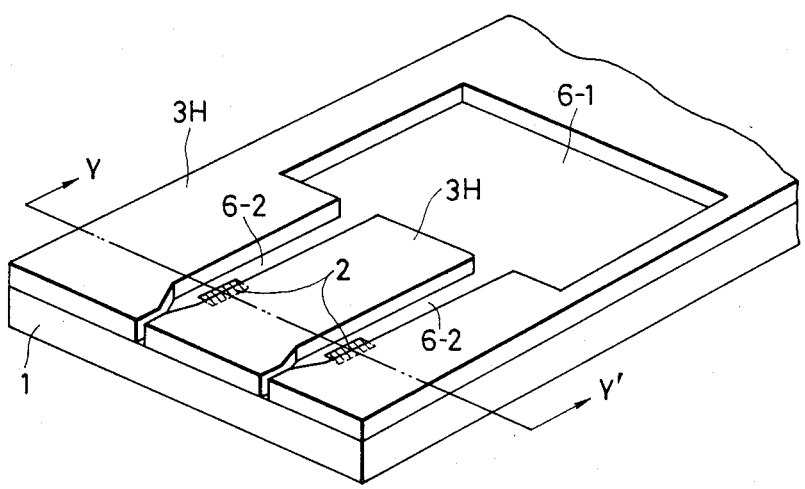
Figure 5B:
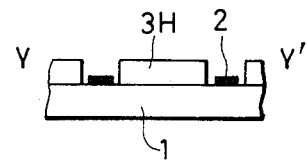

After completion of the pattern exposure of the dry film layer 3, the dry film 3 subjected to exposure is developed by, for example, dipping in a volatile organic solvent such as 1,1,1-trichloroethane, etc., to remove by dissolution the unpolymerized (uncured) portion of the dry film layer 3 which is solvent soluble, thereby forming the grooves which will finally become the liquid passages 6-2 and liquid chamber 6-1 with the resin cured film 3H remaining on the substrate 1 as shown in FIGS. 5A and 5B.

As the next step, the cured resin film 3H on the substrate 1 is subjected to heat polymerization by heating at a temperature of at least 80° C. for about 10 minutes to 3 hours. When a heat curable graft copolymerized polymer is used in the resin composition 3, the heating temperature is made at least 100° C. and heating is conducted for about 5 to 60 minutes.

In the recording head of this embodiment, the grooves for liquid passages 6-2 and liquid chamber 6-1 are formed by referring to an example using a resin composition of the dry film type, namely a solid composition. However, the active energy ray-curing resin composition which can be used in formation of the recording head of the present invention is not limited to only solid compositions, but also a liquid composition may be available.

As the method for forming a layer comprising the composition by use of a liquid resin composition on the substrate, there may be employed, for example, the method according to squeezes as used in preparation of a relief image, namely the method in which a wall with a height corresponding to the desired thickness of the resin composition layer to be formed is provided around the substrate and superfluous resin composition is removed by means of a squeegee, etc. In this case, the resin composition may appropriately have a viscosity of 100 cp to 3000 cp. The height of the wall placed around the substrate is also required to be determined in view of the amount reduced by evaporation of the solvent contained in the light-sensitive resin composition.

When a solid resin composition is employed, it is suitable to use the method in which a dry film is plastered on the substrate by pressure contact under heating.

However, in forming the recording head of the present invention, a solid film type is convenient in handling and also with respect to easy and correct control of the thickness.

Figure 6A:
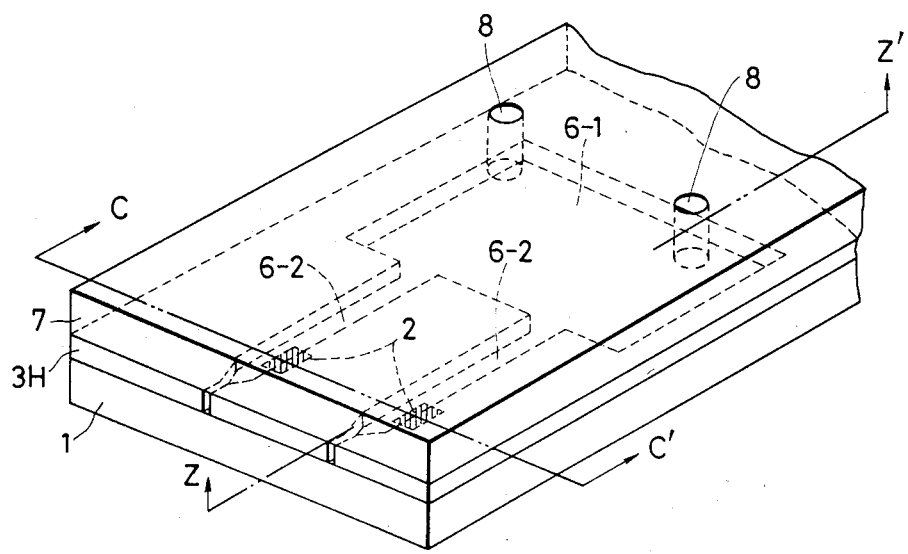
Figure 6B:
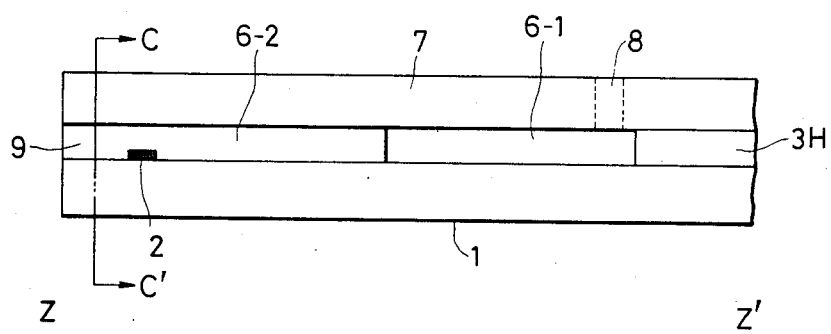

After having thus formed the grooves for constituting deleted the liquid passages 6-2 and the liquid chamber 6-1 with the resin cured film 3H, a flat plate 7 which is a covering over the grooves is bonded with an adhesive on the resin cured film 3H to form a bonded body, as shown in FIGS. 6A and 6B.

In the steps shown in FIGS. 6A and 6B, as the specific method for providing the covering 7, for example, after the flat plate 7 of glass, ceramic, metal, plastic, etc., is applied with an epoxy resin type adhesive by spin coating to a thickness of 3 to 4 μm, the adhesive layer is previously heated to effect the so called B-staging and then plastered on the cured dry film 3H, followed by main curing of the above adhesive layer. However, it is also possible to use no adhesive such as by having a flat plate 7 of a thermoplastic resin such as acrylic resin, ABS resin, polyethylene, etc., thermally fused directly onto the resin cured film 3H.

It is also preferable to use the method in which a resin layer comprising the resin composition for formation of the resin cured film in the present invention is provided on the covering 7 on the side to be bonded to the liquid passages, the resin layer is thermally fused to the resin cured film 3H having formed liquid passages thereon and thereafter heated with irradiation of an active energy ray, namely the method of using the resin composition for formation of the resin cured film in the present invention as the adhesive.

In FIG. 6, 6-1 shows a liquid chamber, 6-2 liquid passages and 8 the thru-holes for connecting feeding pipes (not shown) for feeding the liquid for recording to the liquid chamber 6-1 from outside of the recording head.

After having completed thus the bonding between the resin cured film 3H provided on the substrate 1 and the flat plate 7, the bonded body is cut along C—C' positioned on the downstream side of the liquid passage 6-2 shown in FIGS. 6A and 6B, thereby forming an orifice for discharging the liquid for recording which is the opening portion of the liquid passage at the cut surface.

This step is conducted for making the interval between the discharge energy generating element 2 and the orifice 9 adequate, and the region to be cut may be selected suitably. For this cutting, there may be employed the dicing method, etc., which is conventionally employed in semiconductor industries.

The downstream portion of the liquid passage as mentioned in the present invention refers to the region on the downstream side in the flow direction of the liquid for recording when recording is performed by use of a recording head, more specifically the portion of the liquid passage downstream of the position where the discharge energy generating element 2 is located.

After completion of cutting, the cut surface is smoothed by polishing and a feeding pipe 10 is mounted on the thru-hole 8 to complete a liquid jet recording head as shown in FIG. 1.

In the recording head as described above, the liquid passages 6-2 and the liquid chamber 6-1 are formed integrally with a resin cured film 3H, but the recording head of the present invention is not limited to such a structure, and it is also possible to use a structure in which liquid passages are formed separately from the liquid chamber. However, even if any structure may be taken, the recording head of the present invention is such that at least a part of the resin for forming the liquid passage is formed by use of the active energy ray-curing resin composition as described above. The present invention is described in more detail by referring to the following Synthetic examples and Examples.

SYNTHETIC EXAMPLE 1

A living polymer (butoxymethylacrylamide/2-hydroxyethyl methacrylate=70/30 weight ratio) obtained by anion polymerization was allowed to react with acrylic acid chloride to obtain a macromonomer (acrylic acid poly-butoxymethylacrylamide/2-hydroxyethyl methacrylate) with a weight-average molecular weight of about 3000 having a vinyl group at one terminal end of the molecular chain.

Polymerization of 25 parts by weight of the macromonomer, 70 parts by weight of methyl methacrylate and 5 parts by weight of acrylonitrile in methyl cellosolve gave a heat crosslinkable graft copolymerized polymer having a weight-average molecular weight of $6.8 \times 10^4$ (this is called GP-1). The copolymer chains of the polymethyl methacrylate chain and the polyacrylonitrile chain constituting the main chain of the GP-1 have a glass transition temperature of 105° C. By use of the GP-1, and an active energy ray-curing resin composition (A) was prepared as follows.

| GP-1 | 100 parts by weight |
| Acrylic acid ester of triglycidyl ether of trimethylolpropane | 100 parts by weight |
| Urethane acrylate 11R4003*[3] | 100 parts by weight |
| Copper phthalocyanine | 15 parts by weight |
| p-Toluenesulfonic acid | 3 parts by weight |
| Irugacure 651 | 15 parts by weight |
| Methyl cellosolve | 300 parts by weight |

*[3]: Urethane acrylate produced by Nagase Kasei K.K.

Next, a mill dispersion of the above resin composition (A) was applied on a polyethylene terephthalate film 16 μm thick by a wire bar, followed by drying at 100° C. for 20 minutes, to prepare a dry film having a resin composition layer with a film thickness of 75 μm.

EXAMPLE 1

By use of the dry film prepared in Synthetic Example 1, following the steps of FIGS. 1 to 6 as described previously in the specification, an on-demand type liquid jet recording head having 10 orifices (orifice dimension: 75 μm × 50 μm, pitch 0.125 mm) with heat generating elements [hafnium boride ($HfB_2$)] as the discharge energy generating element was prepared as follows. The recording head was prepared in number of 30 respectively of the same shape.

First, a plurality of heat generating elements were arranged at the predetermined positions on the substrate comprising silicon and electrodes for applying recording signals were connected thereto.

Next, an $SiO_2$ layer (thickness 1.0 μm) as the protective layer was provided on the substrate surface having the heat generating elements arranged thereon, and the surface of the protective layer was cleaned and dried. Then, the dry film with a thickness of 75 μm as shown in the above Synthetic Example heated to 80° C. was laminated on the protective layer at a speed of 0.4 f/min under the pressurizing condition of 1 Kg/cm².

Subsequently, on the dry film provided on the substrate surface, a photomask having a pattern corresponding to the shape of the liquid passages and liquid chamber was superposed and, after performing registration so that the above elements may be provided in the liquid passages to be finally formed, the dry film was exposed to UV-ray with an intensity of 8.2 mW/cm² from above the photomask for 30 seconds.

Next, the dry film exposed was developed by dipping it in 1,1,1-trichloroethane to remove by dissolution the unpolymerized (uncured) portion of the dry film on the substrate, thereby forming grooves which will become finally the liquid passages and liquid chamber with the cured dry film remaining on the substrate.

After completion of development, the cured dry film on the substrate was heated at 150° C. for one hour, followed further by irradiation of UV-ray with an intensity of 50 mW/cm² for 2 minutes to further cure the film.

After having formed thus the grooves for the liquid passages and liquid chamber with the cured dry film, a flat plate comprising soda glass having thru-holes which becomes the covering over the groove formed was applied with an epoxy type resin adhesive to a thickness of 3 μm by spin coating, then preheated to effect B-staging and plastered on the cured dry film, followed further by main curing of the adhesive to effect adhesion fixing, thus forming a bonded body.

Subsequently, on the downstream side of the liquid passages of the bonded body, namely at the position of 0.150 mm toward the downstream side from the positions where the discharge energy generating elements are located, the bonded body was cut vertically relative to the liquid passage by means of a commercially available dicing saw (trade name: DAD 2H/6 model, produced by DISOCO Co.) to form orifices for discharging the liquid for recording.

Finally, the cut surfaces were washed and dried, further smoothed by polishing and feeding pipes for feeding the liquid for recording were mounted at the thru-holes to complete the liquid jet recording heads. Everyone of the recording heads obtained was found to have liquid passages and liquid chamber which have faithfully reproduced the mask pattern and to be excellent in dimensional precision. The orifice dimension was within 50±5 μm and the orifice pitch was within 125±5 μm.

The recording heads thus prepared were tested for quality and durability during prolonged use.

First, for the recording heads obtained, durability test was conducted by dipping them in the liquids for recording having the respective compositions shown below at 60° C. for 1000 hours (the environmental conditions comparable to those of prolonged use of recording head).

| | Liquid components for recording |
|---|---|
| (1) | $H_2O$/diethyleneglycol/glycerine/C.I. Direct Black 154*[1] (= 70/20/5/5 weight parts) pH = 8.0 |
| (2) | $H_2O$/ethyleneglycol/N—methylpyrrolidone/C.I. Direct Blue 199*[2] (= 60/25/10/5 weight parts) pH = 9.0 |
| (3) | $H_2O$/ethyleneglycol/triethyleneglycol/C.I. Acid Red 94*[3] (= 60/25/10/5 weight parts) pH = 7.0 |
| (4) | $H_2O$/diethyleneglycol/C.I. Direct Black 154 (= 75/20/5 weight parts) pH = 10.0 |

Note
*[1] to *[3] are water-soluble dyes, and sodium hydroxide was employed for adjustment of pH.

For each liquid for recording, five recording heads were provided respectively for the durability test.

After the durability test, each head subjected to the test was observed about the bonded state between the substrate and the covering and the cured dry film. As the result, no peel-off or damage could be recognized to show good adhesiveness in all of the recording heads.

Next, separately for the other ten recording heads obtained each head was mounted on a recording device, and the printing test was practiced by use of the above liquids for recording by applying recording signals of $10^8$ pulse continuously on the recording head for 14 hours. For each recording head, immediately after initiation of printing and after elapse of 14 hours, substantially no lowering in performance in both of the discharging performance and printed state can be recognized. Thus, the recording heads were found to be excellent in durability.

COMPARATIVE EXAMPLE 1

Recording heads were prepared in the same manner as in Example 1 except for using a commercially available dry film Vacrel with a thickness of 75 μm (trade name of dry film solder mask, produced by Du Pont de Nemours Co.) and a commercially available dry film Photec SR-3000 with a film thickness of 50 μm (trade name, produced by Hitachi Kasei Kogyo K. K.).

For these recording heads, the same durability test as in Example 1 was practiced.

In the course of durability test, when employing Vacrel as the dry film, peel-off was recognized after 100 hours with the liquids for recording (2) and (4). Also, after 300 hours, peel-off was recognized with the liquids for recording (1) and (3).

On the other hand, when employing Photec SR-3000 as thd dry film, peel-off was recognized after 300 hours with respective liquids for recording of (1) to (4).

SYNTHETIC EXAMPLE 2

Epikote 1001 having an epoxy equivalent of 450 (produced by Shell Chemical) was dissolved in a solvent mixture of 50% toluene and 50% butyl acetate to prepare a 30% solution. Methacrylic acid in an amount of 0.5 equivalent relative to one equivalent of existing epoxy groups was added and 0.2%, on the solid content basis, of N-nitrosodiphenylamine was added as the polymerization inhibitor, followed by addition of 0.5%, on the solid content basis, of LiCl as the catalyst. The reaction was carried out at 70° to 80° C. for 5 hours. Thus, an epoxy resin of which 0.5 equivalent of 1.0 equivalent of epoxy groups were esterified with methacrylic acid, namely a half-esterified epoxy resin was obtained. The half-esterified epoxy resin obtained here is called HE-2.

By use of the above HE-2 and the GP-1 obtained in the Synthetic Example 1, an active energy ray-curing resin composition (B) was prepared as follows.

| GP-1 | 100 parts by weight |
| HE-2 | 150 parts by weight |
| Copper phthalocyanine | 1 parts by weight |
| p-Toluenesulfonic acid | 3 parts by weight |
| Triphenylsulfonium tetrafluoroborate | 10 parts by weight |
| Methyl cellosolve | 300 parts by weight |

Here, the mill dispersion of the resin composition (B) was applied by a wire bar on a polyethylene terephthalate film with a thickness of 16 μm, followed by drying at 100° C. for 20 minutes to prepare a dry film having a resin composition layer with a film thickness of 75 μm, which was used for formation of the liquid jet recording head of the present invention as explained below.

EXAMPLE 2

By use of the dry film prepared in Synthetic Example 2, following the steps of FIGS. 1 to 6 as described previously in the specification, an on-demand type liquid jet recording head having 10 orifices (orifice dimension: 75 μm × 50 μm, pitch 0.125 mm) with heat generating elements [hafnium boride (HfB$_2$)] as the discharge energy generating element was prepared as follows. The recording head was prepared in number of 30 respectively of the same shape.

First, a plurality of heat generating elements were arranged at the predetermined positions on the substrate comprising silicon and electrodes for applying recording signals were connected thereto.

Next, an SiO$_2$ layer (thickness 1.0 μm) as the protective film was provided on the substrate surface having the heat generating elements arranged thereon, and the surface of the protective layer was cleaned and dried. Then, the dry film with a thickness of 75 μm as shown in the above Synthetic Example 2 heated to 120° C. was laminated on the proteotive layer at a roll temperature of 120° C. at a speed of 0.4 f/min. under the pressurizing condition of 1 Kg/cm$^2$ by means of Laminator HRL-24 (trade name, produced by Du Pont Co.). Under this state, on the layer comprising the active energy ray-curing resin composition laminated on the substrate, there is laminated the polyethyleneterephthalate film.

Subsequently, on the dry film provided on the substrate surface, a photomask having a pattern corresponding to the shape of the liquid passages and liquid chamber was superposed and, after performing registration so that the above elements may be provided in the liquid passages to be finally formed, the dry film was exposed to UV-ray with an intensity of 12 mW/cm$^2$ from above the photomask for 60 seconds.

Next, after removing the polyethyleneterephthalate film the dry film exposed was developed by dipping it in 1,1,1-trichloroethane to remove by dissolution the unpolymerized (uncured) portion of the dry film on the substrate, thereby forming grooves which will become finally the liquid passages and liquid chamber with the cured dry film remaining on the substrate.

After completion of development, the cured dry film on the substrate was heated at 150° C. for one hour, followed further by irradiation of UV-ray with an intensity of 50 mW/cm$^2$ for 3 minutes to further cure the film.

After having formed thus the grooves for the liquid passages and liquid chamber with the cured dry film, a flat plate comprising soda glass having thru-holes which becomes the covering over the groove formed was applied with an epoxy type resin adhesive to a thickness of 3 μm by spin coating, then preheated to effect B-staging and plastered on the cured dry film, followed further by main curing of the adhesive to effect adhesion fixing, thus forming a bonded body.

Subsequently, on the downstream side of the liquid passages of the bonded body, namely at the position of 0.150 mm toward the downstream side from the positions where the discharge energy generating elements are located, the bonded body was cut vertically relative to the liquid passage by means of a commercially available dicing saw (trade name: DAD 2H/6 model, produced by DISCO Co.) to form orifices for discharging the liquid for recording.

Finally, the cut surfaces were washed and dried, further smoothed by polishing, and feeding pipes for feeding the liquid for recording were mounted at the thru-holes to complete the liquid jet recording heads. Everyone of the recording heads obtained was found to have liquid passages and liquid chamber which have faithfully reproduced the mask pattern and to be excellent in dimensional precision. The orifice dimension was within 50±5 μm and a orifice pitch was within 125±5 μm.

The recording heads thus prepared were tested or quality and durability during prolonged use.

First, for the recording heads obtained, durability test was conducted by dipping them in the liquids for recording having the respective compositions shown below at 60° C. for 1000 hours (the environmental conditions comparable to those of prolonged use of recording head).

| | Liquid components for recording |
|---|---|
| (1) | $H_2O$/diethyleneglycol/1,3-dimethyl-2-imidazolidinone/ C.I. Direct Blue 86[*1] (= 57/30/10/3 weight parts) pH = 8.0 |
| (2) | $H_2O$/diethyleneglycol/N—methyl-2-pyrrolidone/ C.I. Direct Black 154[*2] (= 55/30/10/5 weight parts) pH = 9.0 |
| (3) | $H_2O$/diethyleneglycol/polyethyleneglycol #400/ N—methyl-2-pyrrolidone/C.I. Direct Yellow 86[*3] (= 65/10/10/10/5 weight parts) pH = 7.0 |
| (4) | $H_2O$/ethyleneglycol/triethyleneglycol/triethyleneglycol monomethyl ether/C.I. Food Black 2[*4] (= 67/10/15/5/3 weight parts) pH = 10.0 |

Note
[*1] to [*4] are water-soluble dyes, and sodium hydroxide was employed for adjustment of pH.

After the durability test, each head subjected to the test was observed about the bonded state between the substrate and the covering and the cured dry film. As the result, no peel-off or damage could be recognized to show good adhesiveness in all of the recording heads.

Next, separately for the other 10 recording heads obtained, each head was mounted on a recording device, and the printing test was practiced by use of the above liquids for recording by applying recording signals of $10^8$ pulse continuously on the recording head for 14 hours. For each recording head, immediately after initiation of printing and after elapse of 14 hours, substantially no lowering in performance in both of the discharging performance and printed state can be recognized. Thus, the recording heads were found to be excellent in durability.

SYNTHETIC EXAMPLE 3

A living polymer (2-hydroxyethyl methacrylate/butyl acrylate=80/20 weight ratio) obtained by anion polymerization was allowed to react with p-vinylbenzyl chloride to obtain a macromonomer (p-vinylbenzylpoly-2-hydroxyethyl methacrylate/butyl acrylate) with a weight-average molecular weight of about 1800 having a vinyl group at one terminal end of the molecular chain. Solution polymerization of 30 parts by weight of the macromonomer and 70 parts by weight of methyl methacrylate in methylcellosolve gave a thermoplastic graft copolymerized polymer having a weight-average molecular weight of $7.0 \times 10^4$ (this is called GP-3). The polymethyl methacrylate chain constituting the main chain of the GP-3 has a glass transition temperature of 100° C.

An amount of 250 g of Epicron 1050 (bisphenol type epoxy resin, epoxy equivalent 450–500, produced by Dainippon Ink Kagaku Kogyo K. K.) was melted at 70° C. in a flask and mixed with 0.5 g of hydroquinone (heat polymerization inhibitor) and 3 g of triethylbenzylammonium chloride. To the mixture was added dropwise 20 g of acrylic acid under stirring over 30 minutes to carry out the reaction. After completion of the dropwise addition, stirring was further continued at 80° C. for 4 hours to complete the reaction. In this reaction, the number of mols of epoxy groups and that of acrylic acid were set to become 10:5. By the above operation, a partially esterified product of Epicron 1050 with acrylic acid was obtained (this is called HE-3).

By use of the GP-1 and the above HE-1, an active ray energy curing type resin composition was prepared as follows.

| | |
|---|---|
| GP-3 (graft copolymerized polymer) | 100 parts by weight |
| HE-3 (epoxy partial ester) | 100 parts by weight |
| Neopentylglycol diacrylate | 60 parts by weight |
| Benzophenone | 12 parts by weight |
| Michler's ketone | 6 parts by weight |
| Crystal Violet | 1 part by weight |
| Methyl ethyl ketone/toluene (1/1 mixture) | 300 part by weight |

The above composition was applied on a 16 μm thick polyethylene terephthalate film (Lumilar T type) by a bar coater to a thickness after drying of about 75 μm and dried in a hot air oven of 100° C. for 10 minutes to prepare a dry film having an active energy ray-curing resin composition layer with a film thickness of 75 μm, which was used for formation of the liquid jet recording head of the present invention as described below.

SYNTHETIC EXAMPLE 4

A dry film having an active energy ray-curing resin layer with a film thickness of 75 μm was prepared in the same manner as in Synthetic Example 3 except for using 60 parts by weight of 2,2-bis[4-(acryloxydiethoxy)-phenyl]propane in place of 60 parts by weight of neopentylglycol diacrylate, and used for formation of the liquid jet recording head of the present invention as described below.

SYNTHETIC EXAMPLE 5

A dry film having an active energy ray-curing resin layer with a film thickness of 75 μm was prepared in the same manner as in Synthetic Example 3 except for using 60 parts by weight of trimethylolpropane triacrylate in place of 60 parts by weight of neopentylglycol diacrylate, and used for formation of the liquid jet recording head of the present invention as described below.

SYNTHETIC EXAMPLE 6

A dry film having an active energy ray-curing resin layer with a film thickness of 75 μm was prepared in the same manner as in Synthetic Example 3 except for using 60 parts by weight of Aronix M-8030[*1] in place of 60 parts by weight of neopentylglycol diacrylate, and used for formation of the liquid jet recording head of the present invention as described below.

[*1]: trade name of polyester acrylate of Toa Gosei Kagaku K. K.

SYNTHETIC EXAMPLE 7

A living polymer (N-methylolmethacrylamide/2-hydroxyethyl methacrylate=30/70 weight ratio) obtained by anion polymerization was allowed to react with p-vinylbenzyl chloride to obtain a macromonomer (p-vinylbenzyl poly-N-methylolmethacrylamide/2-hydroxyethyl methacrylate) with a weight-average molecular weight of about 1500 having a vinyl group at one terminal end of the molecular chain.

Solution polymerization of 30 parts by weight of the macro-monomer with a molecular weight of about 1500 and 70 parts by weight of methyl methacrylate in methyl cellosolve gave a heat-crosslinkable graft copolymerized polymer having a weight-average molecular weight of $7.7 \times 10^4$ (this is called GP-7). The polymethyl methacrylate chain constituting the main chain of the GP-7 has a glass transition temperature of 100° C.

According to the same procedure as in Synthetic Example 3, by use of 250 g of Epicron N-665 (novolac type epoxy resin, epoxy equivalent of 200 to 230, produced by Dainippon Ink Kagaku Kogyo K. K.), acrylic acid was allowed to react therewith so that the ratio of number of mols of epoxy groups number of mols of acrylic acid became 10/5. Thus, a partially esterified product of Epicron N-665 with acrylic acid was obtained (this is called HE-2-1).

By use of the graft copolymerized polymer GP-7 having heat crosslinkability and the partial acrylic acid esterified product HE-2-1, an active energy ray-curing resin composition was prepared as follows:

| | |
|---|---|
| GP-7 (graft copolymerized polymer) | 100 parts by weight |
| HE-2-1 (epoxy partial ester) | 80 parts by weight |
| Neopentylglycol diacrylate | 60 parts by weight |
| Urethane acrylate*2 | 60 parts by weight |
| Benzophenone | 12 parts by weight |
| Michler's ketone | 6 parts by weight |
| Crystal Violet | 1 parts by weight |
| p-toluenesulfonic acid | 3 parts by weight |
| Methyl ethyl ketone/toluene (1/1 mixture) | 400 parts by weight |

*2: urethane acrylate obtained by reacting PPG#400, isophorone diisocyanate and 2-hydroxyethyl acrylate at a ratio of number of mols of OH groups of PPG#400: number of mols of OH groups of isophorone diisocyanate: number of moles of 2-hydroxyethyl acrylate = 2:4:2.

The above composition was applied on a 16 μm thick polyethyleneterephthalate film (Lumilar T type) by a bar coater to a thickness after drying of 75 μm to prepare a dry film having an active energy ray-curing resin composition layer with a film thickness of 75 μm, which was used for formation of the liquid jet recording head of the present invention as described below.

SYNTHETIC EXAMPLE 8

A dry film having an active energy ray-curing resin layer with a film thickness of 75 μm was prepared in the same manner as in Synthetic Example 7 except for using 60 parts by weight of 2,2-bis[4-(acryloxydipropoxy)-phenyl]propane in place of 60 parts by weight of neopentylglycol diacrylate, and used for formation of the liquid jet recording head of the present invention as described below.

EXAMPLE 3

By use of the dry film prepared in Synthetic Example 3, following the steps of FIGS. 1 to 6 as described previously in the specification, an on-demand type liquid jet recording head having 10 orifices (orifice dimension: 75 μm×50 μm, pitch 0.125 mm) with heat generating elements [hafnium boride (HfB$_2$)] as the discharge energy generating element was prepared as follows. The recording head was prepared in number of 30 respectively of the same shape.

First, a plurality of heat generating elements were arranged at the predetermined position on the substrate comprising silicon and electrodes for applying recording signals were connected thereto.

Next, an SiO$_2$ layer (thickness 1.0 μm) as the protective film was provided on the substrate surface having the heat generating elements arranged thereon, and the surface of the protective layer was cleaned and dried. Then, the dry\l film with a thickness of 75 μm as shown in the above Synthetic Example 3 heated to 105° C. was laminated on the protective layer at a roll temperature of 105° C. at a speed of 1 m/min. under the pressurizing condition of 1 Kg/cm$^2$ by means of Laminator HRL-24 (trade name, produced by Du Pont Co.). Under this state, on the layer comprising the active energy ray curing type resin composition laminated on the substrate, there is laminated a polyethyleneterephalate film.

Subsequently, on the dry film provided on the substrate surface, a photomask having a pattern corresponding to the shape of the liquid passages and liquid chamber was superposed and, after performing registration so that the above elements may be provided in the liquid passages to be finally formed, the dry film was exposed to UV-ray by use of a highly parallel light source with an intensity of 12 mW/cm$^2$ in the vicinity of 365 nm from above the photomask for 45 seconds.

Next, after removing the polyethyleneterephthalate film the dry film exposed was developed by dipping it in 1,1,1-trichloroethane to remove by dissolution the unpolymerized (uncured) portion of the dry film on the substrate, thereby forming grooves which will become finally the liquid passages and liquid chamber with the cured dry film remaining on the substrate.

After completion of development, the cured dry film on the.substrate was subjected to post-cure by use of a high pressure mercury lamp with a UV-ray energy of 80 mW/cm$^2$ in the vicinity of 356 nm, followed further by heating at 120° C. for 30 minutes to further cure the film.

After having formed thus the grooves for the liquid passages and liquid chamber with the cured dry film, a flat plate comprising soda glass having thru-holes which becomes the covering over the groove formed was applied with an epoxy type resin adhesive to a thickness of 3 μm by spin coating, then preheated to effect B-staging and plastered on the cured dry film, followed further by main curing of the adhesive to effect adhesion fixing, thus forming a bonded body.

Subsequently, on the downstream side of the liquid passages of the bonded body, namely at the position of 0.150 mm toward the downstream side from the positions where the discharge energy generating elements are located, the bonded body was cut vertically relative to the liquid passage by means of a commerically available dicing saw (trade name: DAD 2H/6 model, produced by DISCO Co.) to form orifices for discharging the liquid for recording.

Finally, the cut surfaces were washed and dried, further smoothed by polishing, and feeding pipes for feeding the liquid for recording were mounted at the thru-holes to complete the liquid jet recording head. Everyone of the recording heads obtained was found to have liquid passages and liquid chamber which have faithfully reproduced the mask pattern and to be excellent in dimensional precision. The orifice dimension was within 50±5 μm and a orifice pitch was within 125±5 μm.

The recording heads thus prepared were tested for quality and durability during prolonged use.

First, for the recording heads obtained, durability test was conducted by dipping them in the liquids for recording having the respective compositions shown below at 60° C. for 1000 hours (the environmental conditions comparable to those of prolonged use of recording head).

| | Liquid components for recording |
|---|---|
| (1) | H₂O/polyethyleneglycol#400/glycerine/C.I. Food Black 2*¹ (= 75/15/5/5 weight parts) pH = 8.0 |
| (2) | H₂O/ethyleneglycol/diethyleneglycol/polyethyleneglycol#400/1,3-dimethyl-2-imidazolidinone/C.I. Food Black 2*¹ (= 55/5/20/10/5/5 weight parts) pH = 9.0 |
| (3) | H₂O/diethyleneglycol/polyethyleneglycol#300 propyleneglycol/C.I. Direct Blue 86*² (= 62/15/15/5/3 weight parts) pH = 7.0 |
| (4) | H₂O/diethyleneglycol/polyethyleneglycol#300/ sulforane/C.I. Direct Blue 86*2 (= 60/15/10/10/5 weight parts) pH = 10.0 |

Note
*¹ to *² are water-soluble dyes, and sodium hydroxide was employed for adjustment of pH.

After the durability test, each head subjected to the test was observed about the bonded state between the substrate and the covering and the cured dry film. As the result, no peel-off or damage could be recognized to show good adhesiveness in all of the recording heads.

Next, separately for the other 10 recording heads obtained, each head was mounted on a recording device, and the printing test was practiced by use of the above liquids for recording by applying recording signals of 10⁸ pulse continuously on the recording head for 14 hours. For each recording head, immediately after initiation of printing and after elapse of 14 hours, substantially no lowering in performance in both of the discharging performance and printed state can be recognized. Thus, the recording heads were found to be excellent in durability.

EXAMPLES 4–8

Liquid jet recording heads were prepared in the same manner as in Example 3 except for using individually the dry films prepared in Synthetic Examples 4–8.

Further, for each of the recording heads prepared, the same durability test and printing test were conducted in the same manner as in Example 3.

After the durability test, each head subjected to the test was observed about the bonded state between the substrate and the covering and the cured dry film. As the result, no peel-off or damage could be recognized to show good adhesiveness in all of the recording heads.

Also, in the printing test, for each recording head, immediately after initiation of printing and after lapse of 14 hours, substantially no lowering in performance in both of the discharging performance and printed state can be recognized. Thus, the recording heads were found to be excellent in durability.

The liquid jet recording head of the present invention uses as the active energy ray-curing resin composition which is the constitutional member of the head a composition having very excellent sensitivity to the active energy ray and resolution as the pattern forming material which are imparted primarily by the monomer having ethylenically unsaturated bonds and/or the half-esterified epoxy resin contained as the component in the composition, and it has been rendered possible to obtain a liquid jet recording head excellent in dimensional precision with good yield by use of the active energy ray-curing resin composition.

Also, the active energy ray-curing resin composition for formation of the resin cured film to be used in the present invention utilizes effectively the characteristics of the graft copolymerized polymer as the essential component and the epoxy resin possessed by the half-esterified epoxy resin, namely having in addition to excellent adhesion to a substrate and mechanical strength imparted primarily by the graft copolymerized polymer excellent chemical resistance and dimensional stability imparted primarily by the half-esterified epoxy resin, whereby it has been also rendered possible to obtain a recording head having durability for a long term by use of the composition.

Further, when the active energy ray-curing resin composition using the graft copolymerized polymer having curability is used, it is possible to obtain a liquid jet recording head which is particularly excellent in the adhesiveness, mechanical strength and chemical resistance.

We claim:

1. A liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition comprising the component (i) shown below and at least one of the components (ii) and (iii) shown below:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkyl-amino containing acrylic monomers, (C) carboxylic containing acrylic or vinyl monomers, (D) N-vinylpyrrolidone or its derivatives, (E) vinylpyridine or its derivatives and (F) acrylamide derivatives represented by the following general formula I:

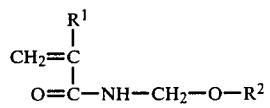

(wherein R¹ represents hydrogen or an alkyl or hydroxyalkyl group having 1 to 3 carbon atoms, and R² represents hydrogen or an alkyl or acyl group having 1 to 4 carbon atoms which may have one or more hydroxy groups), added to said trunk chain;

(ii) an epoxy resin comprising at least one compound having two or more epoxy groups in the molecule, the epoxy groups existing in said epoxy resin being partially esterified with an unsaturated carboxylic acid; and (iii) a monomer having an ethylenically unsaturated bond.

2. A liquid jet recording head according to claim 1, wherein said resin composition curable with an active energy ray comprises 20 to 80 parts by weight of the above graft copolymerized polymer (i) and 80 to 20 parts by weight of the above monomer having an ethylenically unsaturated bond (iii).

3. A liquid jet recording head according to claim 1, wherein said resin composition curable with an active energy ray comprises 0.1 to 20 parts by weight of a photopolymerization initiator per 100 parts by weight of the total amounts of the above graft copolymerized polymer (i) and the above monomer having an ethylenically unsaturated bond (iii).

4. A liquid jet recording head according to claim 1, wherein the above component (ii) is a resin in which an amount corresponding to 0.30 to 0.70 equivalent of 1.0 equivalent of the epoxy groups existing in said epoxy resin is esterified.

5. A liquid jet recording head according to claim 1, wherein the above component (ii) is a resin in which an amount corresponding to 0.45 to 0.55 equivalent of 1.0 equivalent of the epoxy groups existing in said epoxy resin is esterified.

6. A liquid jet recording head according to claim 1, wherein said resin composition curable with an active energy ray comprises 20 to 80 parts by weight of the above graft copolymerized polymer (i) and 80 to 20 parts by weight of the above resin (ii).

7. A liquid jet recording head according to claim 1, wherein said resin composition curable with an active energy ray comprises 0.1 to 20 parts by weight of a radical polymerization initiator which can be activated by the action of an active energy ray formulated per 100 parts by weight of the total amount of the above graft copolymerized polymer (i) and the above resin (ii).

8. A liquid jet recording head according to claim 1, wherein said resin composition curable with an active energy ray comprises 0.2 to 15 parts by weight of an aromatic onium salt compound having photosensitivity containing an element belonging to the group VIa or the group Va of the periodic table formulated per 100 parts by weight of the total amount of the above graft copolymerized polymer (i) and the above resin (ii).

9. A liquid jet recording head according to claim 1, wherein said resin composition curable with an active energy ray comprises 20 to 80 parts by weight of the above graft copolymerized polymer (i), and 80 to 20 parts by weight as the total amount of the above resin (ii) and the monomer having an ethylenically unsaturated bond (iii).

10. A liquid jet recording head according to claim 1, wherein the ratio of the above monomer having an ethylenically unsaturated bond (iii) to the above resin (ii) in said resin composition curable with an active energy ray is 30:70 to 70:30.

11. A liquid jet recording head according to claim 1, wherein said resin composition curable with an active energy ray comprises 0.1 to 20 parts by weight of a radical polymerization initiator which can be activated by the action of an active energy ray formulated by 100 parts by weight of the total amount of the above graft copolymerized polymer (i), the above resin (ii) and the above monomer having an ethylenically unsaturated bond (iii).

12. A liquid jet recording head according to claim 1, wherein said resin composition curable with an active energy ray comprises 0.2 to 15 parts by weight of an aromatic onium salt compound having photosensitivity containing an element belonging to the group VIa or the group Va of the periodic table formulated per 100 parts by weight of the total amount of the above graft copolymerized polymer (i), the above resin (ii) and the above monomer having an ethylenically unsaturated bond (iii).

* * * * *

UNITED STATES PATENT AND TRADEMARK OFFICE
CERTIFICATE OF CORRECTION

PATENT NO. : 4,688,054

DATED : August 18, 1987

INVENTOR(S) : TADAYOSHI INAMOTO, ET AL.

Page 1 of 4

It is certified that error appears in the above-identified patent and that said Letters Patent is hereby corrected as shown below: Title Page:

AT [57] IN THE ABSTRACT

Line 14, "methacrylate," should read --methacrylates,--.

COLUMN 2

Line 26, "as" should read --at--.
Line 42, "requires" should read --require--.

COLUMN 3

Line 15, "frbm" should read --from--.

COLUMN 5

Line 36, "3-chloro-2-bydroxypropyl(meth)acry-" should read --3-chloro-2-hydroxypropyl(meth)acry---.
Line 67, "4-(4-pipenilinoethyl)pyridine" should read --4-(4-piperidinoethyl)pyridine--.

COLUMN 6

Line 26, "monomer" should read --a monomer--.
Line 59, "hydrxyl" should read --hydroxyl--.

COLUMN 7

Line 20, delete "in".

UNITED STATES PATENT AND TRADEMARK OFFICE
CERTIFICATE OF CORRECTION

PATENT NO. : 4,688,054

DATED : August 18, 1987

INVENTOR(S) : TADAYOSHI INAMOTO, ET AL.

Page 2 of 4

It is certified that error appears in the above-identified patent and that said Letters Patent is hereby corrected as shown below:

COLUMN 8

Line 19, "mor" should read --or--.
Line 28, "(a)-(b)" should read --(a)-(d)--.
Line 57, "M-1200 both" should read --M-1200 (both--.

COLUMN 9

Line 50, "caploractonemodified" should read --caprolactone-modified--.

COLUMN 11

Line 47, "triethylbenzylamnonium" should read --triethylbenzylammonium--.
Line 67, "preferably 1:0.2" should read --preferably be 1:0.2--.

COLUMN 12

Line 11, "deteriori-" should read --deterior---.
Line 19, "gives product" should read --gives a product--.
Line 40, "checmical" should read --chemical--.
Line 60, "benzophenone benzo-" should read --benzophenone, benzo---.

COLUMN 13

Line 40, "tellurinm" should read --tellurium--.

UNITED STATES PATENT AND TRADEMARK OFFICE
CERTIFICATE OF CORRECTION

PATENT NO. : 4,688,054
DATED : August 18, 1987
INVENTOR(S) : TADAYOSHI INAMOTO, ET AL.

It is certified that error appears in the above-identified patent and that said Letters Patent is hereby corrected as shown below:

COLUMN 17

Line 5, "exopsure" should read --exposure--.
Line 40, "thier" should read --their--.
Line 57, "phenothiagine," should read --phenothiazine,--.

COLUMN 19

Line 37, "squeezes" should read --squeegees--.
Line 57, delete "deleted".

COLUMN 23

Line 22, "thd" should read --the--.

COLUMN 24

Line 13, "proteotive" should read --protective--.
Line 43, "groove" should read --grooves--.
Line 67, "a" should read --the--.

COLUMN 25

Line 1, "or" should read --for--.

COLUMN 26

Line 4, "active ray" should read --active energy ray--.
Line 5, delete "energy".

UNITED STATES PATENT AND TRADEMARK OFFICE
CERTIFICATE OF CORRECTION

PATENT NO. : 4,688,054

DATED : August 18, 1987

INVENTOR(S) : TADAYOSHI INAMOTO, ET AL.

Page 4 of 4

It is certified that error appears in the above-identified patent and that said Letters Patent is hereby corrected as shown below:

COLUMN 27

Line 10, "groups number" should read --groups to number--.
Line 68, "dryl" should read --dry--.

COLUMN 28

Line 8, "polyetheneterephalate" should read --polyethyleneterephthalate--.
Line 35, "groove" should read --grooves--.
Line 58, "a" should read --the--.

COLUMN 29

Line 47, "lapse" should read --a lapse--.

Signed and Sealed this

Eighth Day of March, 1988

Attest:

DONALD J. QUIGG

Attesting Officer

Commissioner of Patents and Trademarks